US007957211B2

(12) United States Patent
Demone

(10) Patent No.: US 7,957,211 B2
(45) Date of Patent: Jun. 7, 2011

(54) METHOD AND APPARATUS FOR SYNCHRONIZATION OF ROW AND COLUMN ACCESS OPERATIONS

(75) Inventor: Paul Demone, Ottawa (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 0 days.

(21) Appl. No.: 12/878,601

(22) Filed: Sep. 9, 2010

(65) Prior Publication Data

US 2010/0329051 A1  Dec. 30, 2010

Related U.S. Application Data

(63) Continuation of application No. 12/623,899, filed on Nov. 23, 2009, now Pat. No. 7,817,484, which is a continuation of application No. 12/366,024, filed on Feb. 5, 2009, now Pat. No. 7,643,360, which is a continuation of application No. 11/844,746, filed on Aug. 24, 2007, now Pat. No. 7,505,336, which is a continuation of application No. 11/295,492, filed on Dec. 7, 2005, now Pat. No. 7,277,334, which is a continuation of application No. 10/946,016, filed on Sep. 22, 2004, now Pat. No. 7,042,771, which is a continuation of application No. 10/337,972, filed on Jan. 7, 2003, now Pat. No. 6,873,568, which is a continuation of application No. PCT/CA01/00990, filed on Jul. 6, 2001.

(60) Provisional application No. 60/216,682, filed on Jul. 7, 2000.

(30) Foreign Application Priority Data

Jul. 7, 2000  (CA) ...................................... 2313949

(51) Int. Cl.
*G11C 7/00* (2006.01)

(52) U.S. Cl. ...................... 365/194; 365/193; 365/233.1; 365/230.06

(58) Field of Classification Search .................. 365/194, 365/193, 230.01, 233.1, 230.06
See application file for complete search history.

(56) References Cited

U.S. PATENT DOCUMENTS 4,767,947 A  8/1988  Shah
(Continued)

FOREIGN PATENT DOCUMENTS

EP  0278155 A2  8/1988
(Continued)

OTHER PUBLICATIONS

U.S. Appl. No. 12/623,899, Notice of Allowance dated Jul. 19, 2010.
(Continued)

*Primary Examiner* — Viet Q Nguyen
(74) *Attorney, Agent, or Firm* — Shin Hung; Borden Ladner Gervais LLP

(57) ABSTRACT

A circuit for synchronizing row and column access operations in a semiconductor memory having an array of bit line pairs, word lines, memory cells, sense amplifiers, and a sense amplifier power supply circuit for powering the sense amplifiers, the circuit comprising, a first delay circuit for delaying a word line timing pulse by a first predetermined period, a first logic circuit for logically combining the word line timing pulse and the delayed word line timing pulse to produce a sense amplifier enable signal, for enabling a sense amplifier power supply circuit, a second delay circuit for delaying the word line timing pulse by a second predetermined period, and a second logic circuit for logically combining the word line timing pulse and the second delayed word line timing pulse to produce a column select enable signal, for enabling selected ones of a plurality of column access devices wherein the second predetermined time period is selected so that ones of a plurality of column access devices are activated after the sense amplifier power supply circuit is enabled.

9 Claims, 6 Drawing Sheets

U.S. PATENT DOCUMENTS

| | | | |
|---|---|---|---|
| 4,817,056 A | 3/1989 | Furutani et al. | |
| 5,027,326 A * | 6/1991 | Jones | 365/221 |
| 5,119,334 A | 6/1992 | Fujii | |
| 5,134,582 A * | 7/1992 | Ishii | 365/189.08 |
| 5,249,282 A * | 9/1993 | Segers | 711/122 |
| 5,457,696 A * | 10/1995 | Mori | 714/720 |
| 5,513,143 A * | 4/1996 | McClure | 365/195 |
| 5,640,350 A * | 6/1997 | Iga | 365/186 |
| 5,694,369 A | 12/1997 | Abe | |
| 6,094,379 A * | 7/2000 | Sago | 365/190 |
| 6,104,653 A | 8/2000 | Proebsting | |
| 6,108,249 A | 8/2000 | Hayashi et al. | |
| 6,147,925 A | 11/2000 | Tomishima et al. | |
| 6,192,003 B1 | 2/2001 | Ohta et al. | |
| 6,269,050 B1 | 7/2001 | Kwon et al. | |
| 6,339,553 B1 | 1/2002 | Kuge | |
| 6,590,829 B2 | 7/2003 | Takeuchi | |
| 6,639,869 B2 | 10/2003 | Toda et al. | |
| 6,711,083 B2 | 3/2004 | Demone | |
| 6,744,684 B2 | 6/2004 | Arimoto et al. | |
| 6,788,610 B2 | 9/2004 | Nakagawa | |
| 6,873,568 B2 * | 3/2005 | Demone | 365/189.07 |
| 6,891,772 B2 | 5/2005 | Demone | |
| 6,925,022 B2 | 8/2005 | Arimoto | |
| 7,012,850 B2 | 3/2006 | Demone | |
| 7,042,771 B2 * | 5/2006 | Demone | 365/189.08 |
| 7,221,601 B2 * | 5/2007 | Jacunski et al. | 365/191 |
| 7,277,334 B2 * | 10/2007 | Demone | 365/194 |
| 7,321,517 B2 * | 1/2008 | Ikeda et al. | 365/194 |
| 7,450,444 B2 | 11/2008 | Demone | |
| 7,505,336 B2 * | 3/2009 | Demone | 365/194 |
| 7,643,360 B2 * | 1/2010 | Demone | 365/194 |
| 7,751,262 B2 | 7/2010 | Demone | |
| 2003/0151966 A1 | 8/2003 | Demone | |
| 2004/0017700 A1 | 1/2004 | Demone | |
| 2004/0202036 A1 | 10/2004 | Demone | |
| 2005/0036386 A1 | 2/2005 | Demone | |
| 2010/0135089 A1 * | 6/2010 | Demone | 365/194 |

FOREIGN PATENT DOCUMENTS

| | | |
|---|---|---|
| JP | 61-144795 | 7/1986 |
| JP | 62-291215 | 12/1987 |
| JP | 3-245396 | 10/1991 |
| JP | 4-219695 | 8/1992 |
| JP | 61-22492 | 5/1994 |
| JP | 2000-11663 | 1/2000 |
| JP | 2000163966 A | 6/2000 |

OTHER PUBLICATIONS

U.S. Appl. No. 12/366,024, Notice of Allowance dated Aug. 26, 2009.

* cited by examiner

METHOD AND APPARATUS FOR SYNCHRONIZATION OF ROW AND COLUMN ACCESS OPERATIONS

CROSS REFERENCE TO RELATED APPLICATIONS

This application is a continuation of U.S. application Ser. No. 12/623,899, filed Nov. 23, 2009, and issued as U.S. Pat. No. 7,817,484 on Oct. 19, 2010, which is a continuation of U.S. application Ser. No. 12/366,024, filed Feb. 5, 2009, now U.S. Pat. No. 7,643,360, which is a continuation of U.S. application Ser. No. 11/844,746, filed Aug. 24, 2007, now U.S. Pat. No. 7,505,336, which is a continuation of U.S. application Ser. No. 11/295,492, filed Dec. 7, 2005, now U.S. Pat. No. 7,277,334, which is a continuation of U.S. application Ser. No. 10/946,016, filed Sep. 22, 2004, now U.S. Pat. No. 7,042,771, which is a continuation of U.S. application Ser. No. 10/337,972, filed Jan. 7, 2003, now U.S. Pat. No. 6,873,568, which is a continuation of PCT Application No. PCTCA2001/000990, filed Jul. 6, 2001, which claims the benefit of priority to U.S. application Ser. No. 60/216,682, filed Jul. 7, 2000, and Canadian Application No. 2,313,949, filed Jul. 7, 2000.

FIELD OF THE INVENTION

The present invention relates generally to synchronization of row and column access operations in semiconductor memory devices, and specifically to row and column access operations in a high-speed dynamic random access memory.

BACKGROUND OF THE INVENTION

Semiconductor memory integrated circuits have traditionally utilized an internal architecture defined in an array having rows and columns, with the row-column address intersections defining individual data storage locations or memory cells. Typically, these intersections are addressed through an internal address bus, and the data to be stored or read from the locations is transferred to an internal input/output bus. Groups of data storage locations are normally coupled together along word lines. Semiconductor configurations utilizing this basic architecture include dynamic random access memory (DRAM), static random access memory (SRAM), electrically programmable read only memory (EPROM), erasable EPROM (EEPROM), as well as "flash" memory.

One of the more important measures of performance for such memory devices is the total usable data bandwidth. The main type of timing delay affecting the data bandwidth is referred to as access time. Access time is defined as the delay between the arrival of new address information at the address bus and the availability of the accessed data on the input/output bus.

In order to either read data from or write data to a DRAM memory array, a number of sequential operations are performed. Initially, bit line pairs are equalized and pre-charged. Next, a selected word line is asserted in order to read out the charge state of an addressed memory cell onto the bit lines. Bit line sense amplifiers are then activated for amplifying a voltage difference across the bit line pairs to full logic levels. Column access transistors, which are typically n-channel pass transistors, are then enabled to either couple the bit line state to DRAM read data amplifiers and outputs, or to overwrite the bit line state with new values from DRAM write data inputs.

In nearly all DRAM architectures, the two dimensional nature of the memory array addressing is directly accessible to the external memory controller. In asynchronous DRAM architectures, separate control signals are used for controlling the row (or x-address) and column (or y-address) access operations. In synchronous DRAM architectures, it is also possible to use separate row and column control signals as described above. Furthermore, for synchronous DRAM architectures it is possible to employ a single command path for both row and column control signals.

In these cases, bit line sense amplifier activation is usually performed as the last stage of a self-timed sequence of DRAM operations initiated by a row activation command. Column access transistors are controlled by the y-address decoding logic and are enabled by the control signals associated with individual read and write commands.

However, for both asynchronous and synchronous DRAM architectures, the ability to minimize the timing margin between bit line sensing and the enabling of the column access transistors is limited by the timing variability between the separate control paths for row access and column access operations. Even in synchronous designs, the x-address and y-address decoding logic paths are quite distinct. The timing variability between the completion of bit line sensing and the commencement of column access transistor activation comprises the sum of the variability between the x and y address decoding paths, the variability of the self-timed chain that activates the bit line sense amplifiers, and the time of flight differences in control signals. That is, the control signals arrive at a given memory array from row and column control logic located in separate regions of the memory device and therefore may have different activation timing.

In order to reduce DRAM access times and increase the rate at which read and write operations can be performed it is important to attempt to reduce the time needed for each of the previously mentioned sequential operations necessary for the functioning of a DRAM. Furthermore, equally important is the need to initiate each successive DRAM access function as soon as possible after the previous operation.

Specifically, the delay between bit line restoration and the enabling of the column activation device is critical for both correct DRAM operation and achieving low access latency. If the column access transistor is enabled too soon, the memory cell read out on to the bit lines may be corrupted. The corruption can occur directly from noise on the bit lines coupled through the column access transistors or indirectly through capacitive coupling between a bit line driven through the column access transistor and an adjacent unselected bit line. Since the data is read destructively, if it is corrupted, it cannot be retrieved. On the other hand, if the column access transistor is enabled too late, unnecessary delay is added to memory access latency. Furthermore, the equalization and pre-charge of the bit lines in preparation for a subsequent access operation may effectively be unable to proceed until the column access transistors are turned off.

Therefore, there is a need for a memory device that can initiate successive DRAM access functions with little or no unnecessary delay without corrupting memory cell data. Accordingly, it is an object of the present invention to obviate or mitigate at least some of the above mentioned disadvantages.

SUMMARY OF THE INVENTION

In accordance with an embodiment of the present invention there is provided a semiconductor memory having a Dynamic Random Access Memory (DRAM) with an array of bit line pairs, word lines, memory cells, sense amplifiers, and a sense amplifier power supply circuit for powering said sense amplifiers. The circuit comprises a word line timing pulse for activating of at least one of the word lines, a first delay circuit coupled with the word line timing pulse for delaying the word line timing pulse by a first predetermined period, and a first logic circuit for logically combining the word line timing pulse and the word line timing pulse delayed by the first delay circuit. The output of the first logic circuit provides a sense amplifier enable signal for enabling the sense amplifier power supply circuit. The circuit further comprises a second delay circuit coupled with the word line timing pulse for delaying the word line timing pulse by a second predetermined period. The circuit further comprises a second logic circuit for logically combining the word line timing pulse and the word line timing pulse delayed by the second delay circuit for providing a column select enable signal. The column select enable signal enables selected ones of a plurality of column access devices, which are activated a predetermined time period after the sense amplifier power supply circuit is enabled.

There is also provided a method for synchronizing row and column access operations in a semiconductor memory. A Dynamic Random Access Memory (DRAM) having an array of bit line pairs, word lines, memory cells, sense amplifiers, and a sense amplifier power supply circuit for powering said sense amplifiers is provided. The method comprises the steps of generating a word line timing pulse for activating of at least one of the word lines, delaying the word line timing pulse by a first predetermined time, and logically combining the word line timing pulse and the first delayed word line timing pulse for providing a sense amplifier enable signal. The sense enable signal enables the sense amplifier power supply circuit. The method further comprises the steps of delaying the word line timing pulse by a second predetermined time and logically combining the word line timing pulse and the second delayed word line timing pulse for providing a column select enable signal. The column select enable signal enables selected ones of a plurality of column access devices wherein the selected ones of a plurality of column access devices are activated a predetermined time period after the sense amplifier power supply circuit is enabled.

BRIEF DESCRIPTION OF THE DRAWINGS

The present invention will now be described by way of example only with reference to the following drawings in which.

DETAILED DESCRIPTION

Figure 1:
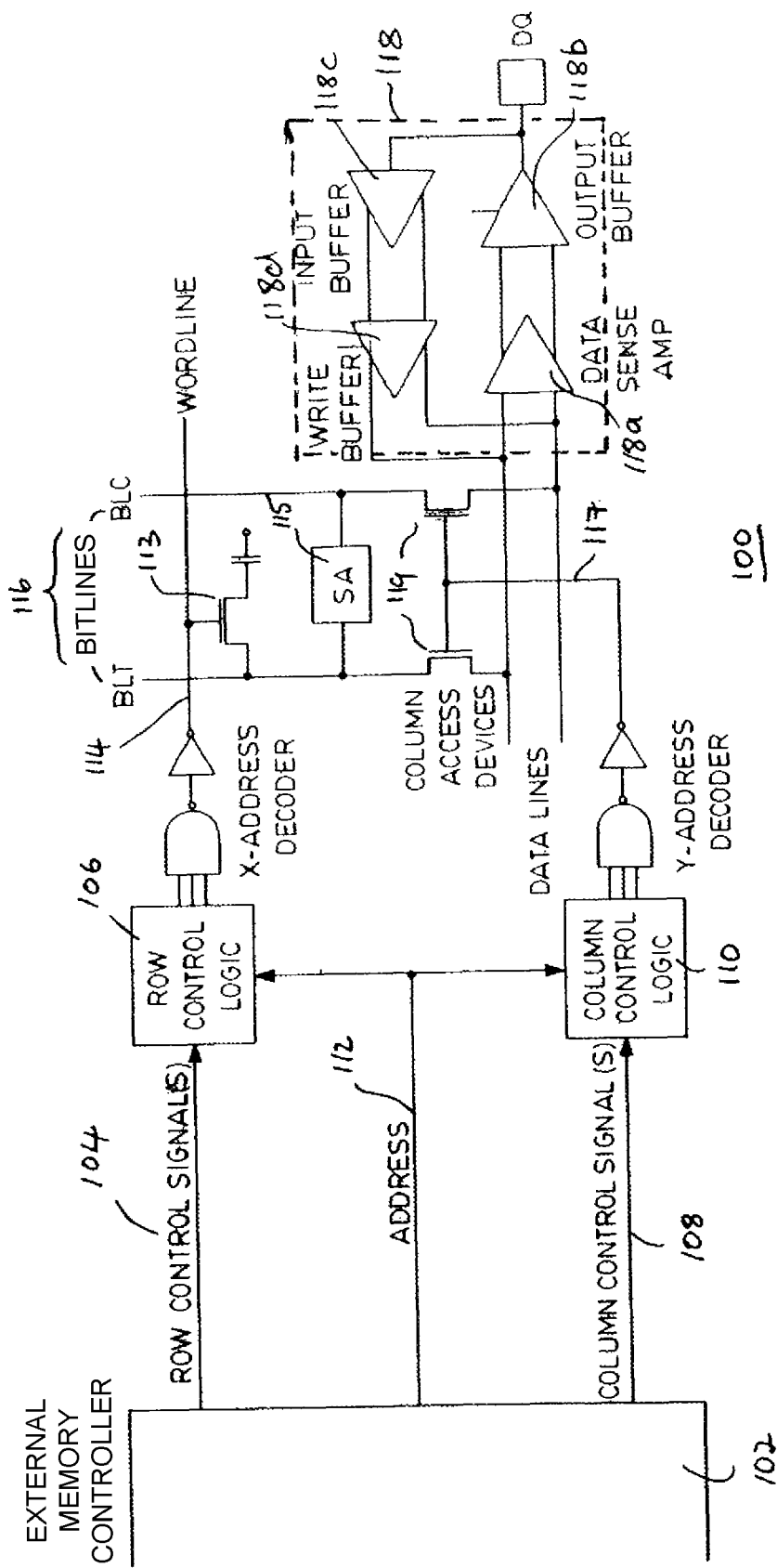
FIG. 1 is a schematic drawing of an asynchronous DRAM architecture (prior art)

For convenience, like numerals in the description refer to like structures in the drawings. Referring to FIG. 1, a prior art implementation of an asynchronous DRAM architecture using separate control signals for controlling the row and column access operations is shown generally by numeral 100. All bit line pairs are (BLT and BLC) precharged and equalized prior to an active cycle. An external memory controller 102 transmits row control signals 104 to a row control logic device 106. The external memory controller 102 sends column control signals 108 to a column control logic device 110. The external memory controller 102 also sends an address signal 112 to both the row control logic device 106 and the column control logic device 110.

In response to an activation signal, the row control logic device 106 asserts word line 114 via an x-address decoder in accordance with decoding of the address signal 112. The charge state of memory cell 113 is read on to a pair of complementary bit lines 116. A sense amplifier 115 amplifies the voltage across the bit lines 116. The column control logic 110 then asserts column select signal 117 via a y-address decoder in accordance with decoding of the address signal 112. The column select signal enables the column access devices (transistors) 119. The intersection of word line 114 and bit lines 116 is an address specified by the address signal 112. The address is to be read from the memory array datelines via a data bus sense amplifier 118a and subsequently an output buffer 118b or written to the memory array from port DQ via an input buffer 118c and subsequently a write buffer 118d.

Figure 2:
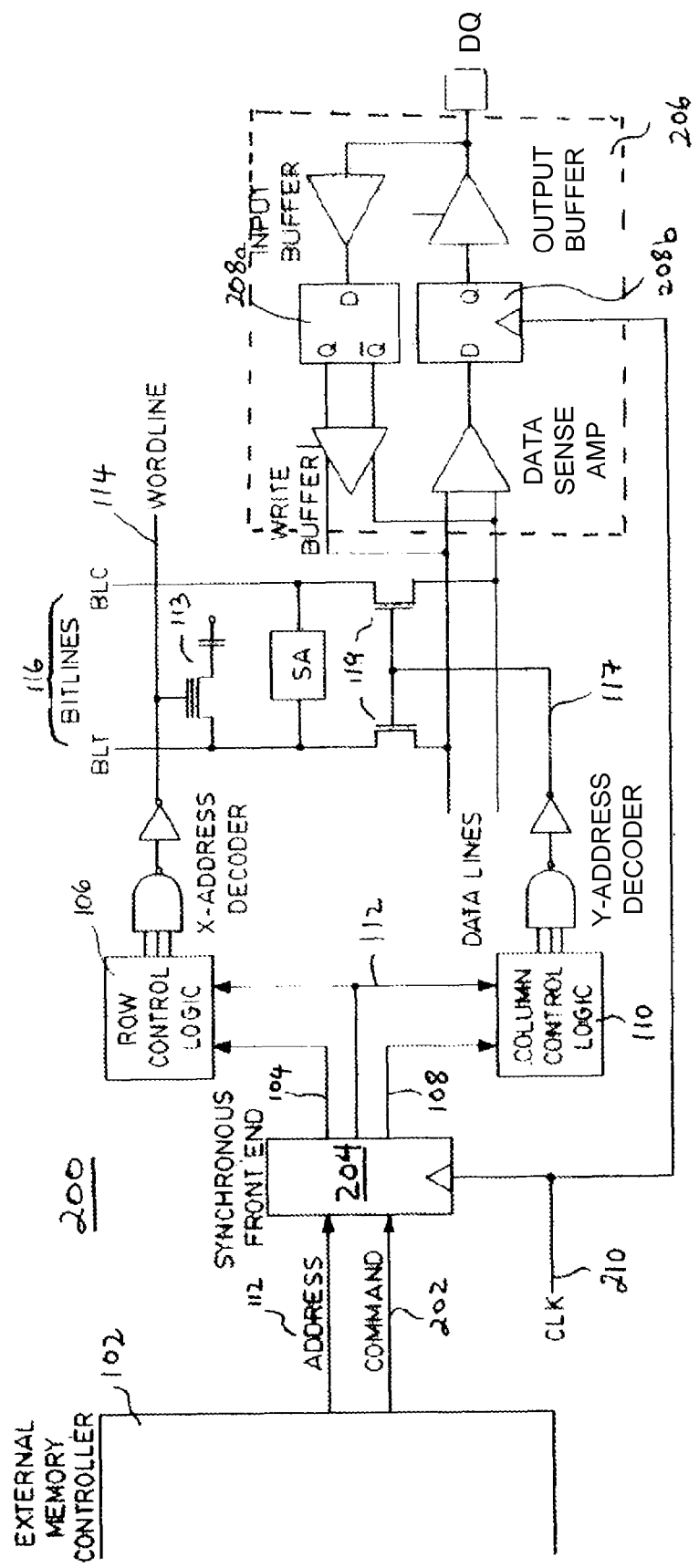
FIG. 2 is a schematic drawing of a synchronous DRAM architecture with a common command and address path (prior art)

Referring to FIG. 2, a prior art implementation of a synchronous DRAM architecture having a single command path for both row and column access operations is illustrated generally by numeral 200. The external memory controller 102 sends an address signal 112 and a command signal 202 to a synchronous front end 204. The synchronous front end 204 provides the address signal 112 to a row control logic device 106 as well as a column control logic device 110. Further, the synchronous front end 204 provides row control signal(s) 104 to the row control logic device 106 and column control signal(s) 108 to the column control logic device 110.

The row control logic device 106 and the column control logic device 110 assert word line 114 and column select signal 117 in a similar fashion to that described above with reference to FIG. 1. An input/output path 206 functions similarly to the input/output path 118 illustrated in FIG. 1 with the exception that input/output path 206 also contains input and output data latches 208a and 208b respectively for providing synchronous transfer of data. Both of the synchronous front end 204 and the latches 208 are clocked by the same clock 210.

Both the implementations described with reference to FIG. 1 and FIG. 2 suffer from the timing uncertainty and variability between bit line sensing and column access transistor activation. One method for reducing timing uncertainty and variability between bit line sensing and column access transistor activation comprises synchronizing the two operations locally within the peripheral region of the selected memory array. By combining the activation of column access transistors with a control signal generated based on bit line sense amplifier activation, it is possible to greatly reduce the unnecessary delay between bit line sensing and column access. This allows memory access latency to be reduced and memory operations to be performed at a faster rate.

Figure 3:
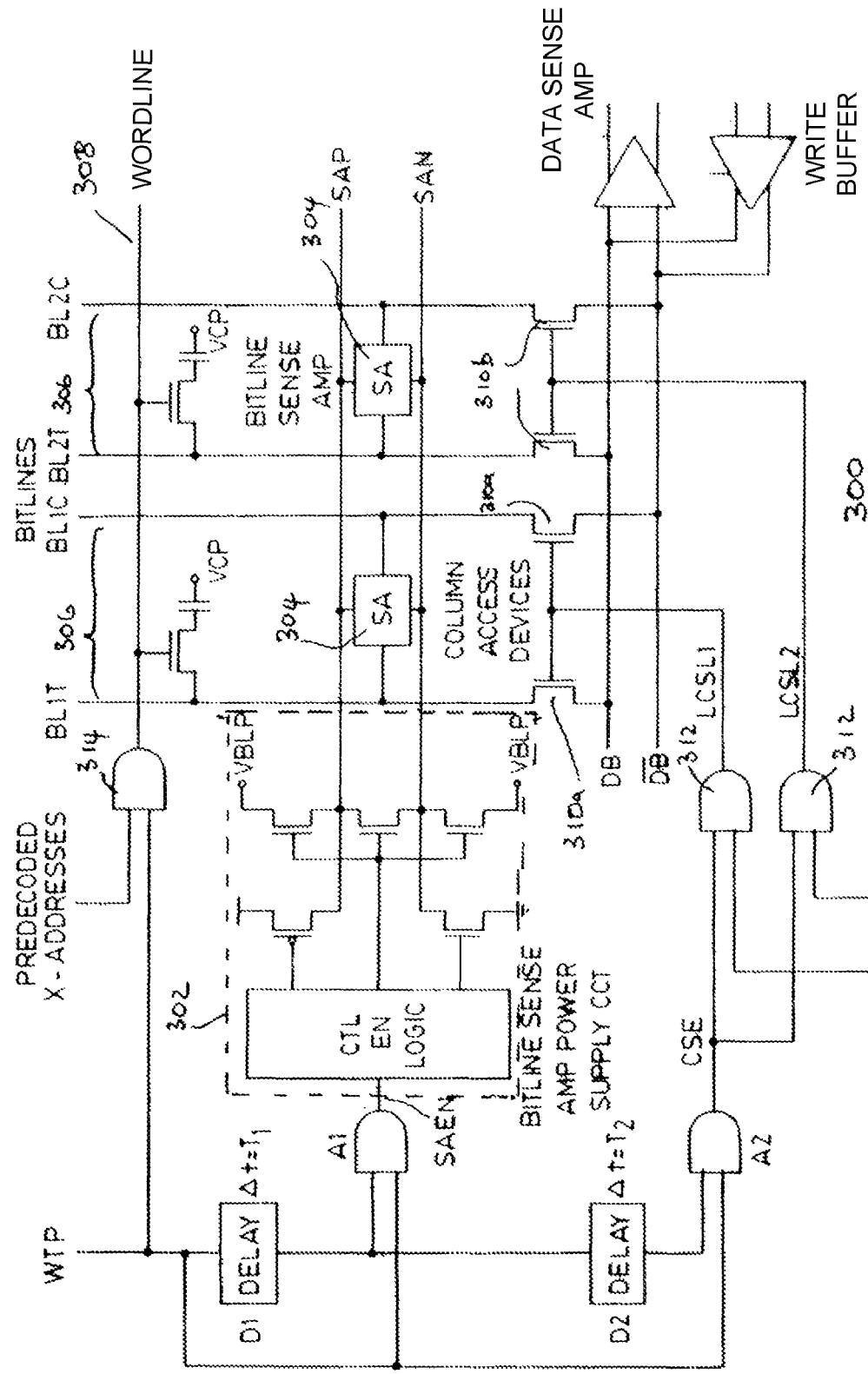
FIG. 3 is a schematic drawing of a DRAM architecture according to an embodiment of the present invention.

Referring to FIG. 3, a DRAM architecture in accordance with an embodiment of the present invention is illustrated generally by numeral 300. A word line timing pulse signal WTP is coupled to the input of a first delay element D1. The output of the first delay element D1 is coupled to the input of an AND gate A1. The word line timing pulse WTP is a second input to the AND gate A1. The output of AND gate A1 is a sense amplifier enable signal SAEN, which is the input to a bit line sense amplifier power supply circuit 302. The bit line sense amplifier power supply circuit 302 powers the sense amplifiers 304 for amplifying the voltage across bit line pairs 306. Power is provided by selectively coupling p-channel supply signal SAP and n-channel supply signal SAN to the positive supply voltage $V_{DD}$ and ground supply voltage $V_{SS}$ respectively during an active sensing cycle, and to bit line precharge voltage $V_{BLP}$ during a precharge cycle.

The output of the first delay element D1 is further coupled to the input of a second delay element D2. The output of the second delay element D2 is coupled to the input of a second AND gate A2. The word line timing pulse WTP is a second input to the AND gate A2. The output of the AND gate A2 is a column select enable signal CSE. The CSE signal is combined with global column select signals $GCSL_J$ comprised of predecoded column address signals via AND gates 312 (only two of which are shown for simplicity) which generate local column select signals $LCSL_J$. Local column select signals $LCSL_J$ in turn enable the appropriate column to be accessed. The word line timing pulse WTP is also coupled to an associated word line 308 via a plurality of AND gates 314 (only one of which is shown for simplicity) for enabling the appropriate word line as selected by a pre-decoded x-address.

Figure 4:
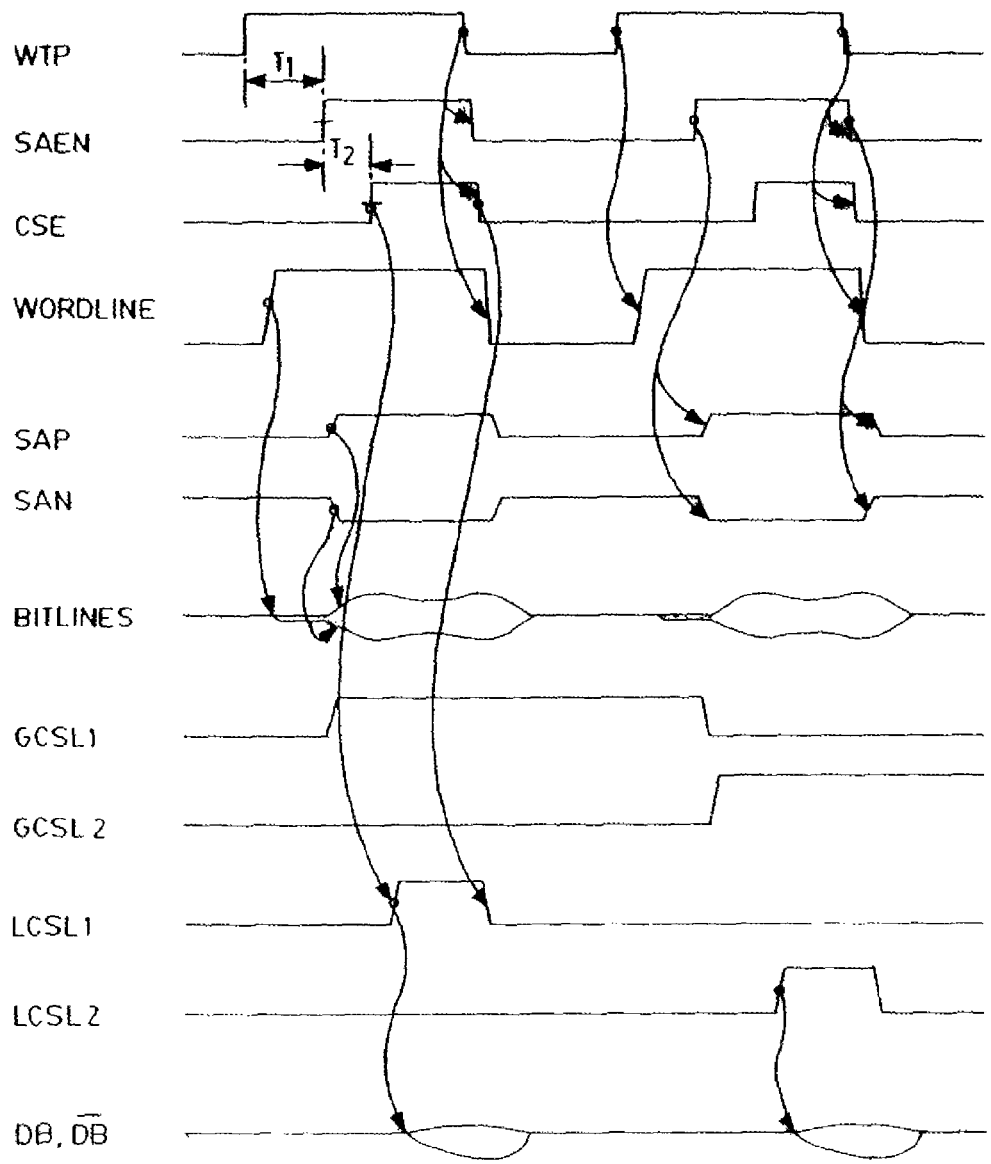
FIG. 4 is a timing diagram for the DRAM architecture illustrated in the FIG. 3.

Referring to FIG. 4, a timing diagram for the above-described circuit is shown. The operation of the circuit will be described with reference to FIGS. 3 and 4 and will refer to a read operation although a write operation will be apparent to a person skilled in the art once the read operation has been described. In response to a rising edge of the word line timing pulse WTP, a selected word line rises, turning on the access transistor for that memory cell. The data stored in the selected cell is dumped on to the bit line and charge sharing between the cell and bit line capacitance occurs. After a delay T1 (generated by delay element D1) from receiving a rising edge of the word line timing pulse WTP, the bit line sense amplifiers 304 are enabled by the assertion of the sense amplifier enable signal SAEN. Asserting the sense amplifier enable signal SAEN causes the sense amplifier power supply circuit 302 to drive the voltage on the sense amplifier power supply rails SAP and SAN from the bit line pre-charged voltage $V_{BLP}$ to the positive supply voltage $V_{DD}$ and ground supply voltage $V_{SS}$ respectively. Once the sense amplifier has been enabled, the data on the bit line is amplified to full swing levels.

After a delay of T2 (generated by the delay element D2) from the assertion of the sense amplifier enable signal, the column select enable signal CSE is asserted. The column select enable signal CSE is used to qualify a set of global column select signals $GCSL_J$ generated by the y-address decode logic for local column selection. Column select signals $LCSL_J$ local to the individual DRAM array, are generated by AND-ing the column select enable CSE signal with the global column select signals $GCSL_J$. Therefore, when the column select enable signal CSE is asserted and a global column select signal $GCSL_J$ is asserted, a corresponding local column select signal $LCSL_J$ is enabled. The local column select signal $LCSL_J$, in turn, enables the column access transistor 310 which couples the local bit lines to the data buses. Thus, referring again to FIG. 4, a local column select signal $LCSL_1$ is generated after a delay of T1 and T2. The local column select signal $LCSL_1$ enables a first column access transistor 310a. During a second read cycle initiated by the next rising edge of the of the word line timing pulse WTP, a second local control signal $LCSL_2$ is enabled after a delay of T1 and T2. The second local column select signal $LCSL_2$ enables a second column access transistor 310b. In the present embodiment, $LCSL_2$ is implied to be different to $LCSL_1$ for illustrative purposes although this need not be the case.

The local column select enable signal $LCSL_J$ is activated after a delay of T1 and T2 from the rising edge of the word line timing pulse WTP and is deactivated by the falling edge of the column select enable signal CSE. The sense amplifiers are powered by the bit line sense amplifier power supply circuit 302 after a delay of T1 from the rising edge of the word line timing pulse WTP and are deactivated by the falling edge of the SAEN signal. The AND gates A1 and A2 ensure that both the sense amplifier enable signal SAEN and the column select enable signal CSE are disabled immediately in response to the falling edge of the word line timing pulse WTP. The word line 308 is enabled as long as the word line timing pulse WTP is active.

Therefore, synchronization of the enabling of column access transistors within an individual DRAM array to a predetermined time period after the activation of the bit line sense amplifiers associated with that array is achieved. It should be noted that the predetermined delay between the sense amplifiers can be selectively programmed to achieve optimum read and write performance.

Figure 5:
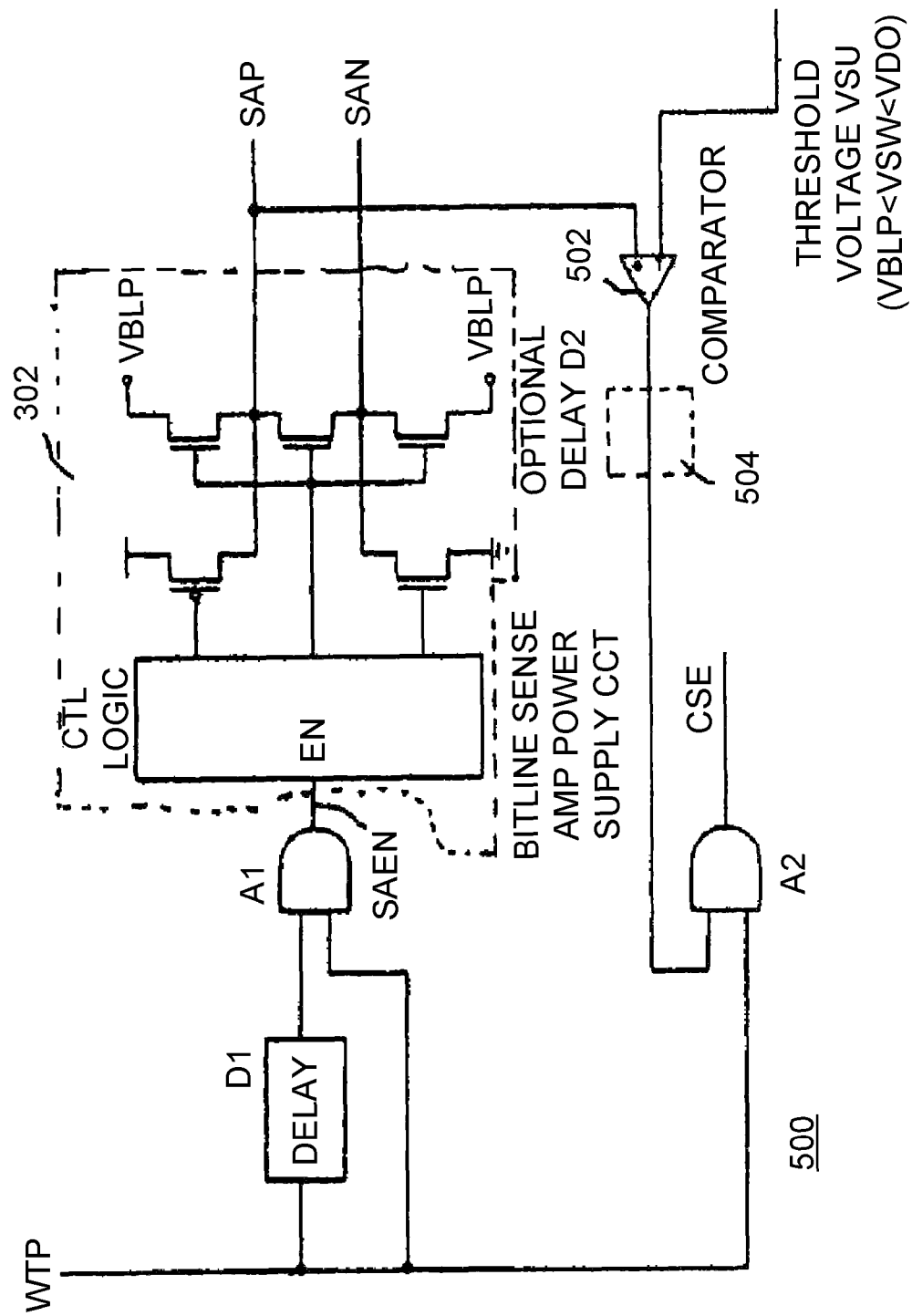
FIG. 5 is an alternative embodiment of the schematic diagram illustrated in FIG. 3.

Referring to FIG. 5, an alternate embodiment to that described in FIG. 3 is illustrated generally by numeral 500. The bit line sense amplifier power supply circuit 302 is enabled by AND-ing the timing control signal WTP with a delayed version of the timing control signal WTP, as was described in the previous embodiment. However, in the present embodiment, the column select enable signal CSE is a result of AND-ing the timing control signal WTP with the output of a comparator 502.

The comparator 502 compares the level of either one of the p-channel or n-channel supply signals SAP and SAN respectively with a predetermined threshold voltage $V_{SW}$. In FIG. 5, the comparator compares the p-channel supply signal SAP with the threshold voltage $V_{SW}$, which is set to have a value between $V_{BLP}$ and $V_{DD}$. As soon as SAP rises above the threshold voltage $V_{SW}$, the comparator asserts a corresponding output, thereby enabling the column select enable signal CSE via and gate A2. The column select enable signal CSE is used for enabling the column select signals (not shown) as described in the previous embodiment.

In yet an alternate embodiment, instead of receiving the p-channel supply signal SAP, the comparator receives the n-channel supply signal SAN and the threshold voltage $V_{SW}$ is set to a value between $V_{BLP}$ and $V_{SS}$. Therefore, once the n-channel supply signal SAN voltage is below the predefined threshold value $V_{SW}$, the output of the comparator will be such that the column select enable signal CSE is enabled. The column select enable signal CSE is used for enabling the column select signals as described in the first embodiment. Optionally, for either of the above-mentioned embodiments, a further delay element 504 may be added for providing a delay before enabling the column select enabling signal CSE.

Figure 6:
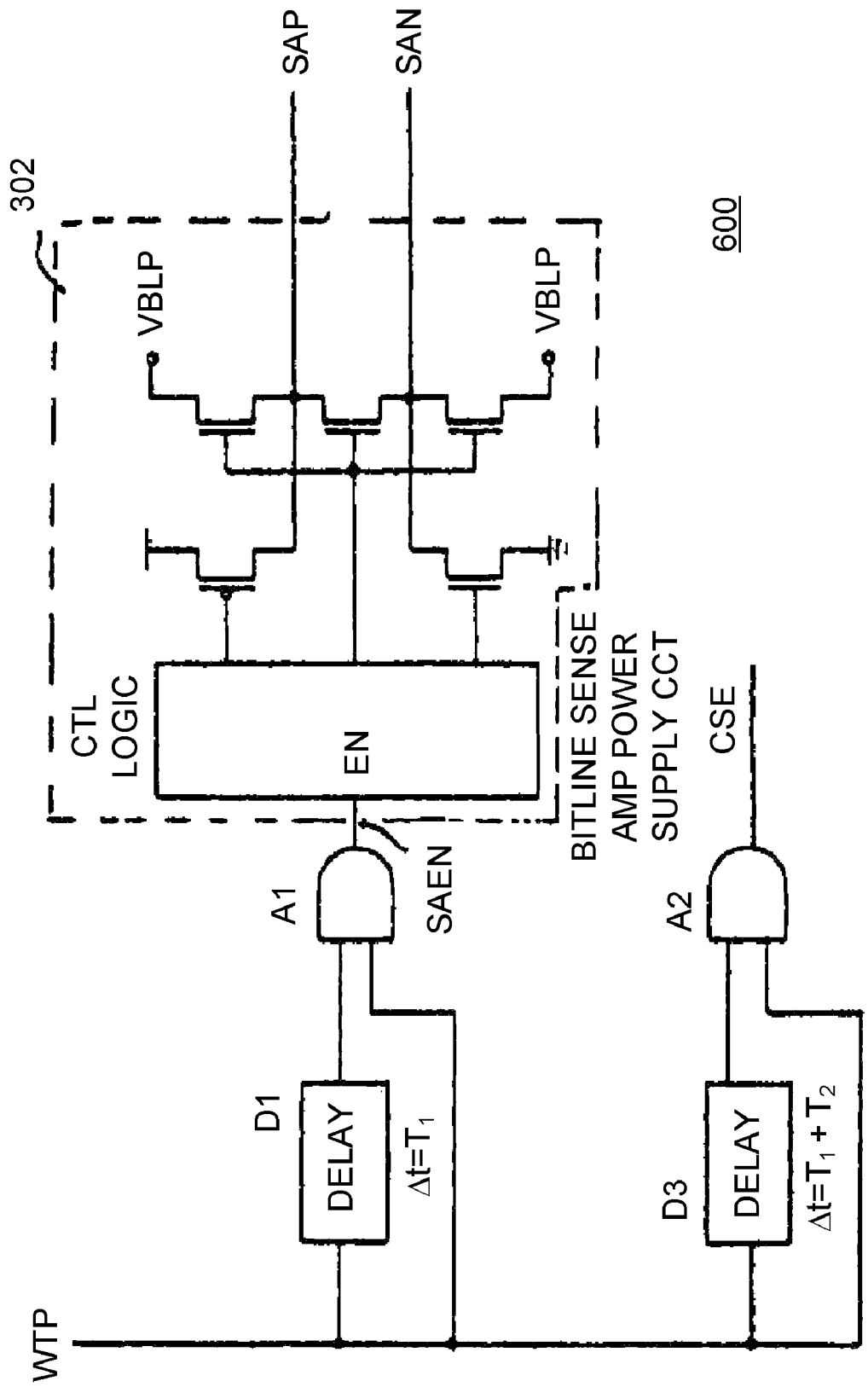
FIG. 6 is yet an alternate embodiment of the schematic diagram illustrated in FIG. 3.

Yet an alternate embodiment is illustrated in FIG. 6 and represented generally by numeral 600. As in the previous embodiments, the sense amplifier enable signal SAEN is generated as a result of AND-ing the word line timing pulse WTP with a delayed version of the word line timing pulse WTP. However, in the present embodiment the column select enable signal is a result of AND-ing the word line timing pulse WTP with a delayed version of the word line timing pulse WTP. A second delay element D3 delays the word line timing pulse WTP by a combined time delay of T1 and T2. Therefore, unlike the first embodiment, the word line timing pulse WTP is presented directly at the input of the second delay element D3.

The time between the negation of the word line timing pulse WTP and the disabling of the bit line sense amplification power supply circuit 302 can be adjusted by inserting a delay element between the word line timing pulse WTP and the input of the AND gate A1. Similarly, the time between the negation of the word line timing pulse WTP and the negation of the column select enable signal CSE can be adjusted by inserting a delay element between the word line timing pulse WTP and the input of AND gate A2.

Since more precise control of the timing between bit line sensing and column access is achieved by all of the previous embodiments, it is also possible to initiate column access while bit line sensing is only partially complete for further accelerating read and write operations.

Although the invention has been described with reference to certain specific embodiments, various modifications thereof will be apparent to those skilled in the art without departing from the spirit and scope of the invention as outlined in the claims appended hereto. Furthermore, the invention may be applicable to any type of electronic memory organized in array and addressed using distinct and sequential x and y addressing phases. These include SRAM and various non-volatile memories such EPROM, EEPROM, flash EPROM, and FRAM.

What is claimed is:

1. A semiconductor memory device on a chip including an array of memory cells associated with a sense amplifier power supply circuit and a plurality of column access devices; and an interface coupled to the array of memory cells, the interface comprising:
   first delay circuitry for delaying a wordline timing pulse by a first predetermined delay amount to provide a first delayed wordline timing pulse;
   a first enable circuit for providing a sense amplifier enable signal in response to the wordline timing pulse and the first delayed wordline timing pulse;
   second delay circuitry for delaying the wordline timing pulse by a second predetermined delay amount to provide a second delayed wordline timing pulse, the second predetermined delay amount being greater than the first predetermined delay amount;
   a second enable circuit for providing a column select enable signal in response to the wordline timing pulse and the second delayed wordline timing pulse; and
   enabling circuitry configured to enable:
   the sense amplifier power supply circuit in response to the sense amplifier enable signal, and
   selected ones of the plurality of column access devices in response to the column select enable signal, after the sense amplifier power supply circuit is enabled.

2. The semiconductor memory device on a chip of claim 1, wherein the memory cells comprise dynamic random access memory.

3. The semiconductor memory device on a chip of claim 1, wherein the interface comprises a static random access memory interface.

4. The semiconductor memory device on a chip of claim 1, wherein the wordline timing pulse, the sense amplifier enable signal and column select enable signal are all local with respect to the memory array.

5. The semiconductor memory device on a chip of claim 1, wherein each of the first and second delay circuitry comprises a delay element.

6. The semiconductor memory device on a chip of claim 5, wherein the delay element of the second delay circuitry is coupled with the word line timing pulse via the delay element of the first delay circuitry.

7. The semiconductor memory device on a chip of claim 1, further comprising a plurality of logic circuits for logically combining the column select enable signal with a plurality of column address signals for enabling the selected ones of a plurality of column access devices.

8. The semiconductor memory device on a chip of claim 1, wherein the first enable circuit comprises a logic circuit configured to logically combine the wordline timing pulse and the first delayed wordline timing pulse to provide the sense amplifier enable signal.

9. The semiconductor memory device on a chip of claim 8, wherein the second enable circuit comprises a logic circuit configured to logically combine the wordline timing pulse and the second delayed wordline timing pulse to provide the column select enable signal.

* * * * *